US011644506B2

(12) United States Patent
Tseng et al.

(10) Patent No.: US 11,644,506 B2
(45) Date of Patent: May 9, 2023

(54) POWER SWITCH FAULT DETECTION METHOD AND POWER SWITCH FAULT DETECTION CIRCUIT

(71) Applicant: DELTA ELECTRONICS, INC., Taoyuan (TW)

(72) Inventors: Shao-Kai Tseng, Taoyuan (TW); Yuan-Qi Hsu, Taoyuan (TW); Pai-En Cheng, Taoyuan (TW)

(73) Assignee: DELTA ELECTRONICS, INC., Taoyuan (TW)

( * ) Notice: Subject to any disclaimer, the term of this patent is extended or adjusted under 35 U.S.C. 154(b) by 32 days.

(21) Appl. No.: 17/188,190

(22) Filed: Mar. 1, 2021

(65) Prior Publication Data

US 2022/0065933 A1   Mar. 3, 2022

(30) Foreign Application Priority Data

Aug. 28, 2020   (CN) .......................... 202010885448.1

(51) Int. Cl.
*H02H 3/08* (2006.01)
*H02H 9/02* (2006.01)
*G01R 31/327* (2006.01)
*H02H 1/00* (2006.01)

(52) U.S. Cl.
CPC ....... *G01R 31/3277* (2013.01); *H02H 1/0007* (2013.01); *H02H 3/08* (2013.01)

(58) Field of Classification Search
CPC ..... H02H 3/08; H02H 1/0007; G01R 31/3277
USPC ....................................................... 361/93.1
See application file for complete search history.

(56) References Cited

U.S. PATENT DOCUMENTS 4,752,886 A * 6/1988 Gareis ............... G01R 31/3277
714/736

FOREIGN PATENT DOCUMENTS

| EP | 3 531 543 | * | 8/2019 |
| JP | 2012 120376 | * | 6/2012 |
| JP | 2012120376 A | | 6/2012 |

OTHER PUBLICATIONS

Office Action corresponding to Taiwanese application No. 109129473 dated May 26, 2021. (pp. 6).

* cited by examiner

*Primary Examiner* — Jared Fureman
*Assistant Examiner* — Lucy M Thomas
(74) *Attorney, Agent, or Firm* — Muncy, Geissler, Olds & Lowe, P.C.

(57) ABSTRACT

A fault detection method is used to determine whether a power switch coupled to a DC bus of a power conversion circuit is faulted. The method includes: detecting a bus voltage to provide a voltage signal and acquiring at least one detection value according to the voltage signal; providing control signals sequentially to turn off or turn on the power switch; determining that the power switch is a short-circuit fault if a first detection value is greater than or equal to a first threshold value when the power switch is turned off; determining that the power switch is an open-circuit fault if a second detection value is less than a second threshold value when the power switch is turned on; and providing an alarm signal or a disable signal when the power switch is the short-circuit fault or the open-circuit fault.

5 Claims, 8 Drawing Sheets

POWER SWITCH FAULT DETECTION METHOD AND POWER SWITCH FAULT DETECTION CIRCUIT

BACKGROUND

Technical Field

The present disclosure relates to a power switch fault detection method and a power switch fault detection circuit, and more particularly to a power switch fault detection method and a power switch fault detection circuit to determine whether a power switch is faulted by comparing a voltage signal with a threshold voltage value.

Description of Related Art

The statements in this section merely provide background information related to the present disclosure and do not necessarily constitute prior art.

The frequency converter (for example, an inverter) with a power conversion system is a common power equipment at present, and its application range is very wide, such as from small household appliances to large mine grinders and compressors, and so on. The use of frequency converters is to control the speed of the motor, which resulting in a significant improvement in energy efficiency, and that is one of the main reasons for using frequency converters. The inverter technology is closely related to power electronic systems, including semiconductor switching components, inverter topology, inverter controlling and simulation technology, hardware and firmware controls, and so on.

The most common type of power conversion system is the motor control applied to elevators, and a front stage of the power conversion system usually uses a power conversion circuit to couple with the frequency converter through a DC link. When the power conversion circuit of the front stage of the frequency converter is a unidirectional power conversion architecture, a braking circuit is usually used to adjust the DC link voltage to avoid the continuous increase of the DC link voltage when the frequency converter is operating in the power generation mode, which may cause system failure. However, since the damage of the braking circuit usually requires additional hardware to detect, it will increase additional costs. In addition, it is necessary to wait for the components of the braking circuit to heat up to a certain level (i.e., high temperature), which will cause the failure of the braking circuit to be immediately dealt with, resulting in the potential risk of damage to the power conversion system.

SUMMARY

In order to solve the above-mentioned problems, a power switch fault detection method is provided. The power switch fault detection method determines whether a power switch coupled to a DC bus on an output side of a power conversion circuit is faulted. The method includes: receiving, by a control unit, a voltage signal provided by continuously detecting a bus voltage of the DC bus, and acquiring at least one detection value according to the voltage signal; determining, by the control unit, whether a first control signal provided to turn off the power switch; if a determination result is "YES", the first control signal is provided to turn off the power switch, and if the determination result is "NO", a second control signal is provided to turn on the power switch; comparing, by the control unit, whether a first detection value acquired corresponding to the voltage signal is greater than or equal to a first threshold value when the first control signal is provided to turn off the power switch; if a comparison result is "YES", the power switch is determined to be a short-circuit fault, and if the comparison result is "NO", the power switch is determined to be normally turned off; comparing, by the control unit, whether a second detection value acquired corresponding to the voltage signal is less than a second threshold value when the second control signal is provided to turn on the power switch; if a comparison result is "YES", the power switch is determined to be an open-circuit fault, and if the comparison result is "NO", the power switch is determined to be normally turned on; and providing, by the control unit, an alarm signal or a disable signal when the power switch is determined to be the short-circuit fault or the open-circuit fault.

In order to solve the above-mentioned problems, a power switch fault detection circuit is provided. The switch fault detection circuit determines whether a power switch coupled to a DC bus on an output side of a power conversion circuit is faulted. The power switch fault detection circuit includes a detection circuit and a control unit. The detection circuit is coupled to the DC bus, and detects a bus voltage across a bus capacitor of the DC bus to provide a voltage signal. The control unit is coupled to the detection circuit, and receives the voltage signal to acquire a detection value according to the voltage signal. The power switch is applied to a braking circuit, and the braking circuit is coupled between an output side of the power conversion circuit and an input side of a frequency conversion circuit. The control unit provides at least one control signal to turn on or turn off the power switch and performs a fault detection of the power switch according to the detection value.

The main purpose of the present disclosure is to provide a power switch fault detection method and a power switch fault detection circuit, in which when the known control signal is used to control turning on or turning off the power switch, the control unit compares the threshold value according to the detection value acquired by continuously detecting the voltage signal provided by the bus voltage so as to determine whether the power switch is faulted, and therefore the detection circuit is simpler and the operation method is easier.

It is to be understood that both the foregoing general description and the following detailed description are exemplary, and are intended to provide further explanation of the present disclosure as claimed. Other advantages and features of the present disclosure will be apparent from the following description, drawings and claims.

BRIEF DESCRIPTION OF DRAWINGS

The present disclosure can be more fully understood by reading the following detailed description of the embodiment, with reference made to the accompanying drawing as follows.

DETAILED DESCRIPTION

Figure 1:
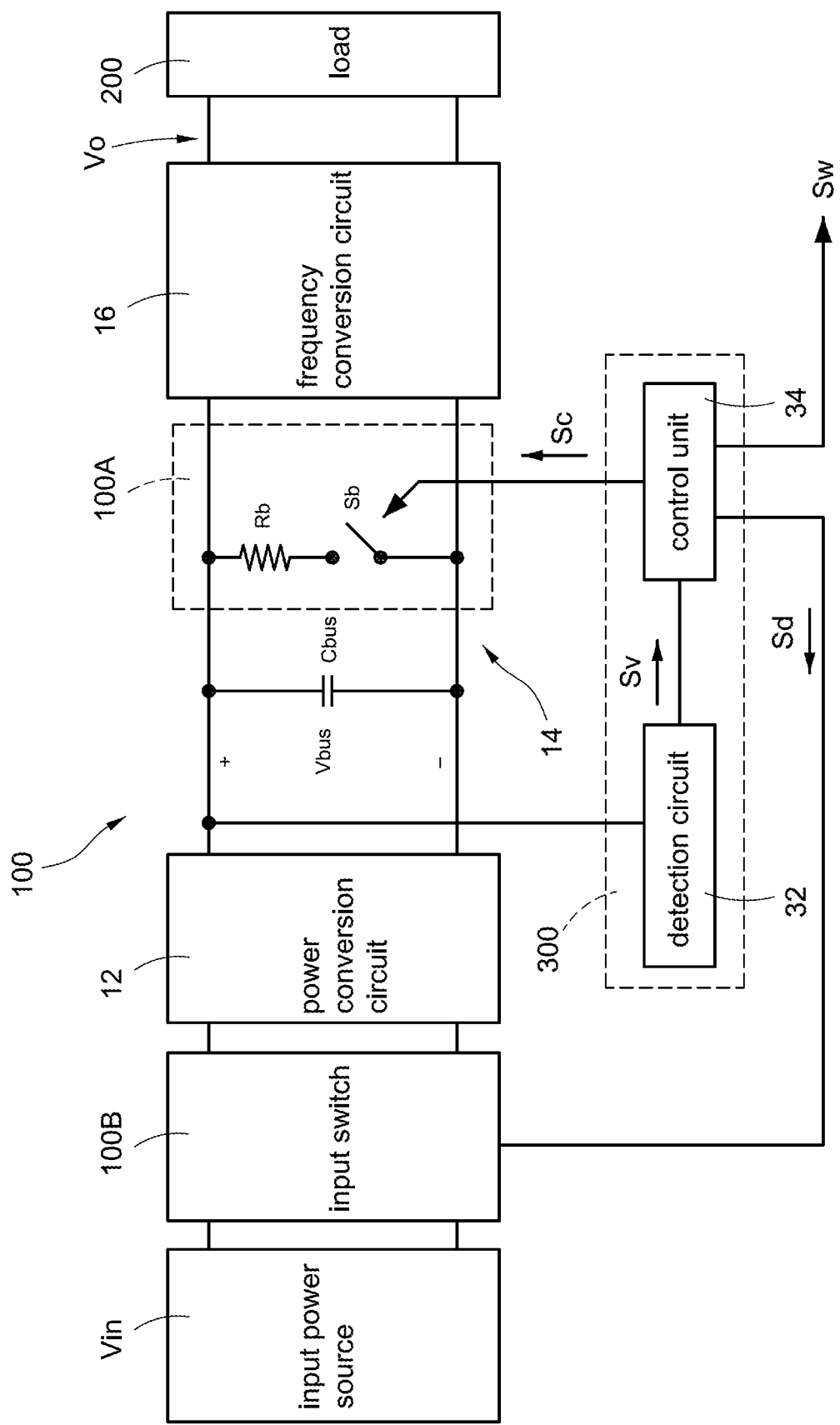
FIG. 1 is a block diagram of a power conversion system having a power switch fault detection system according to the present disclosure.

Reference will now be made to the drawing figures to describe the present disclosure in detail. It will be understood that the drawing figures and exemplified embodiments of present disclosure are not limited to the details thereof.

Please refer to FIG. 1, which shows a block diagram of a power conversion system having a power switch fault detection system according to the present disclosure. The power conversion system 100 is, for example but not limited to, applied to an inverter, which is coupled between an input power source Vin and a load 200. The power conversion system 100 converts a voltage of the input power source Vin into an output power source Vo for supplying power to the load 200. A power switch fault detection circuit 300 is coupled to the power conversion system 100, and is used to detect whether a power switch Sb of the power conversion system 100 is faulted or not when the power conversion system 100 operates. The power switch Sb may be installed on a braking circuit 100A of the power conversion system 100, and the detailed description will be made as follows. The power conversion system 100 includes a power conversion circuit 12, a DC bus 14, and a frequency conversion circuit 16. At least a bus capacitor Cbus, a bus resistor Rb, and the power switch Sb are installed on the DC bus 14. An input side of the power conversion circuit 12 receives the input power source Vin, and an output side of the power conversion circuit 12 is coupled to an input side of the frequency conversion circuit 16 through the DC bus 14. In detail, the power conversion circuit 12 converts the voltage of the input power source Vin into a bus voltage Vbus, and the bus voltage Vbus is provided to the frequency conversion circuit 16 through the DC bus 14. The input side of the frequency conversion circuit 16 receives the bus voltage Vbus, the bus voltage Vbus is converted into the output power source Vo by the frequency conversion circuit 16, and an output side of the frequency conversion circuit 16 provides the output power source Vo to the load 200. The bus capacitor Cbus and the bus resistor Rb are electrically coupled in parallel, and electrically coupled between the output side of the power conversion circuit 12 and the input side of the frequency conversion circuit 16. The bus resistor Rb is electrically connected to the power switch Sb in series. Specifically, when the power conversion system 100 is applied to the inverter, the bus voltage Vbus is a DC link voltage across the bus capacitor Cbus connected between a positive end and a negative end of the DC bus 14. The bus capacitor Cbus stores electrical energy corresponding to the bus voltage Vbus. When the bus voltage Vbus is greater than or equal to the determined voltage value Vd, the power switch Sb is turned on so that the stored excess electric energy is consumed through a loop of the bus resistor Rb to the ground end. The loop that composed of the bus resistor Rb, the power switch Sb, and the ground end is the braking circuit 100A of the power conversion system 100. That is, the braking circuit 100A is constructed on the DC bus 14 and is between the output side of the power conversion circuit 12 and the input side of the frequency conversion circuit 16. When the bus voltage Vbus is less than the determined voltage value Vd, the power switch Sb is turned off to avoid continuous energy consumption through a loop composed of the bus resistor Rb to the ground end, which resulting in waste of energy or damage to the bus resistor Rb.

The power conversion system 100 further includes an input switch 100B which is electrically coupled between the input power source Vin and the input side of the power conversion circuit 12. The input switch 100B may be constructed by a hardware or a loop. When the input switch 100B does not receive a disable signal Sd, a default state of the input switch 100B is turned on, and therefore the input power source Vin can be provided to the power conversion circuit 12. When the input switch 100B receives the disable signal Sd, the input switch 100B is turned off so that the input power source Vin fails to be provided to the power conversion circuit 12 for a safety protection. In one embodiment, the frequency conversion circuit 16 is a bidirectional conversion circuit, that is, besides the frequency conversion circuit 16 being able to convert the bus voltage Vbus into the output power source Vo, the frequency conversion circuit 16 can also convert the output power source Vo into the bus voltage Vbus.

The power switch fault detection circuit 300 further includes a detection circuit 32 and a control unit 34. The detection circuit 32 is electrically coupled to the DC bus 14 and the control unit 34, and thus the detection circuit 32 provides a voltage signal Sv to the control unit 34 according to the bus voltage Vbus when the power conversion circuit 12 operates. The control unit 34 is electrically coupled to the power switch Sb of the braking circuit 100A and the input switch 100B, and the control unit 34 receives the voltage signal Sv provided from the detection circuit 32 and then provides a control signal Sc to turn on or turn off the power switch Sb according to the voltage signal Sv, thereby performing the fault detection of the power switch Sb of the braking circuit 100A. Specifically, when an open-circuit fault occurs to the power switch Sb and the power switch Sb cannot be normally turned on, an alarm needs to be issued to activate the power conversion system 100 to perform fault disposing, or to disable the frequency conversion circuit 16 thereby avoiding damage to the power conversion system 100 due to the failure of the power switch Sb. In particular, an alarm signal Sw produced from the control unit 34 can directly or indirectly (for example, through other controllers) deal with the faults of the power conversion system 100. As mentioned above, when the load 200 is controlled by the frequency conversion circuit 16 and operated in the power generation mode, the output power source Vo provided by the load 200 is reversely converted into the bus voltage Vbus by the frequency conversion circuit 16, and the bus voltage Vbus charges the bus capacitor Cbus. Since the load 200 is controlled by the frequency conversion circuit 16 and operated in the power generation mode, once the power switch Sb occurs the open-circuit fault, the excess charging energy cannot be released through the loop composed of the bus resistor Rb, the power switch Sb, and the ground end. In one embodiment, the released loop is the braking circuit 100A. Therefore, the voltage value of the bus voltage Vbus gradually increases to greater than the determined voltage value Vd so as to increase the failure risk of the power conversion system 100.

When a short-circuit fault occurs to the power switch Sb and the power switch Sb cannot be normally turned off, the input power source Vin needs to be immediately disconnected to prevent the bus resistance Rb from being continuously turned on and even being damaged due to heating. Specifically, when the power switch Sb cannot be turned off due to a fault condition, the energy will continuously to be released through the braking circuit 100A composed of the bus resistor Rb, the power switch Sb, and the ground end so that the bus resistance Rb generates heat because of continuously turning on the power switch Sb, thereby causing the risk of overheating and burning. In one embodiment, the control unit 34 turns on or turns off the power switch Sb, but the operation of the frequency conversion circuit 16 is controlled by another controller (not shown). The control unit 34 and the controller (not shown) can also be separated or integrated according to actual needs. The detailed description of the power switch Sb of the braking circuit 100A will be made as follows. In one embodiment, the power conversion system 100 is mainly applied to a power control system of an elevator, and therefore the power switch fault detection circuit 300 is mainly applied to the fault detection of a power switch of a braking circuit of the elevator system, and the load 200 can be, for example but not limited to, a motor that drives the elevator up and down. For example, any power system with a braking circuit 100A (or a braking resistor connected in series with a power switch) can be used in the power switch fault detection circuit 300 of the present disclosure for power switch fault detection, and the load 200 can also be other power circuits, and the present disclosure is not limited to this.

Figure 2A:
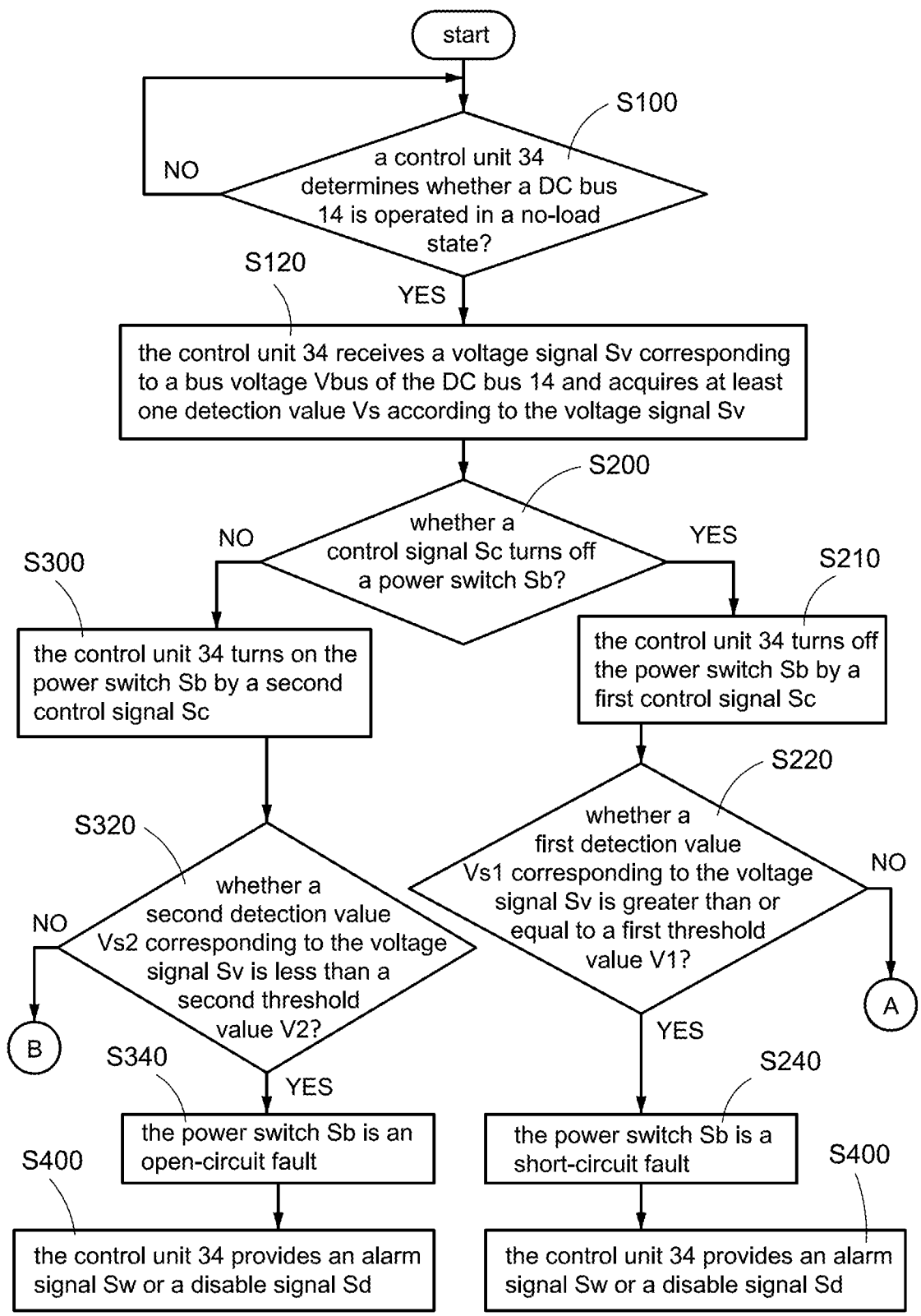
FIG. 2A and FIG. 2B are flowcharts of a power switch fault detection method according to the present disclosure.
Figure 2B:
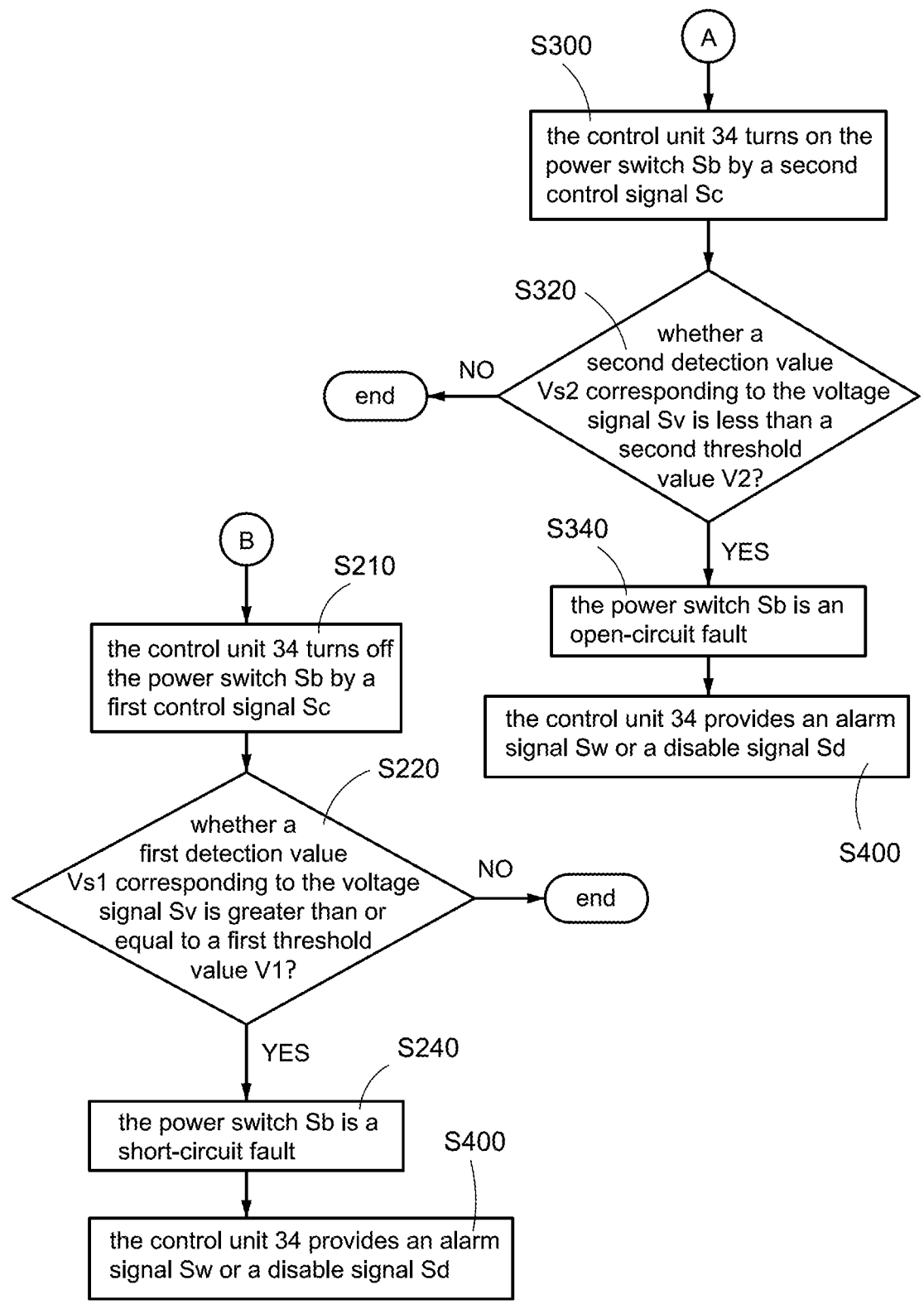

Please refer to FIG. 2A and FIG. 2B, which show flowcharts of a power switch fault detection method according to the present disclosure, and also refer to FIG. 1. FIG. 2A shows the main process of the method, and FIG. 2B shows the secondary process of the method. Before detecting whether the power switch Sb of the braking circuit 100A is faulted, the control unit 34 may first determine whether the DC bus 14 is operated in a no-load state (S100). If the determination result in S100 is "NO", the step S100 can be repeatedly performed until the DC bus 14 is operated in the no-load state so as to reduce the interference conditions of detection and achieve a better detection effect. Specifically, information about whether the DC bus 14 is operated in the no-load state or not can be acquired by detecting the voltage value of the bus voltage Vbus, the input current value or output current value of the frequency conversion circuit 16 by the control unit 34 or through the notification (of a controller) of the load 200. When the DC bus 14 is operated in the no-load state, it means that the load 200 and the frequency conversion circuit 16 are in a standby state. At this condition, it is a better timing to perform fault detection of the power switch Sb of the braking circuit 100A. That is, the control unit 34 only needs to determine relatively fewer variables, and the failure of the power switch Sb can be determined and properly processed in advance by detecting in the no-load state or the standby state, thereby avoiding damaging other circuit components. However, the present disclosure can also detect in load or non-standby state, and is not limited to this. Afterward, after the control unit 34 confirms that the DC bus 14 is operated in the no-load state, the control unit 34 receives the voltage signal Sv corresponding to the bus voltage Vbus provided by continuously detecting by the detection circuit 32 under the operation of the power conversion circuit 12, and then calculates the voltage signal Sv to correspondingly acquire at least one detection value Vs (S120).

Afterward, the control unit 34 determines whether the control signal Sc is provided to turn off the power switch Sb according to the current voltage signal Sv during detection (S200). Specifically, if the ripple value of the voltage signal Sv by continuously detecting the bus voltage Vbus is large within a specific time period, it is possible that the power switch Sb can be normally turned on or has a short-circuit fault (i.e., continuously connected) as shown in a time period t2 of FIG. 3. Therefore, the control unit 34 determines whether one control signal (for example, a first control signal Sc) should be provided at this time to detect whether the power switch Sb can be normally turned off (S200). On the contrary, if the ripple value of the voltage signal Sv by continuously detecting the bus voltage Vbus is relatively small, it is possible that the power switch Sb can be normally turned off or has an open-circuit fault (i.e., continuously disconnected) as shown in a time period t1 of FIG. 3. Therefore, the control unit 34 determines whether another control signal (for example, a second control signal Sc) should be provided at this time to detect whether the power switch Sb can be normally turned on. Such repeated operations can confirm whether the turned-off and turned-on functions of the power switch Sb are faulted, and will not be misjudged by the voltage signal Sv. Therefore, if the determination result in the step (S200) is "YES", the control unit 34 determines that the first control signal Sc can be provided immediately to turn off the power switch Sb so as to determine whether the power switch Sb can be normally turned off (S210). After the control unit 34 provides the first control signal Sc to turn off the power switch Sb, the control unit 34 determines whether a first detection value Vs1 corresponding to the voltage signal Sv is greater than or equal to a first threshold value V1 by comparing them (S220). In particular, the first threshold value V1 is a ripple value of the voltage signal Sv when the power switch Sb can be normally turned on. If the comparison result in the step (S220) is "YES", it represents that the power switch Sb is a short-circuit fault (S240). On the contrary, if the comparison result in the step (S220) is "NO", a step (S300) shown in FIG. 2B is successively performed. Afterward, the turned-on function of the power switch Sb is determined through steps (S300) to (S340).

In addition, if the determination result in the step (S200) is "NO", the control unit 34 determines that the second control signal Sc should be provided immediately to turn on the power switch Sb so as to determine whether the power switch Sb can be normally turned on (S300). After the control unit 34 provides the second control signal Sc to turn on the power switch Sb, the control unit 34 determines whether a second detection value Vs2 corresponding to the voltage signal Sv is less than a second threshold value V2 by comparing them (S320). In particular, the second threshold value V2 is a ripple value of the voltage signal Sv when the power switch Sb can be normally turned off. If the comparison result in the step (S320) is "YES", it represents that the power switch Sb is an open-circuit fault (S340). On the contrary, if the comparison result in the step (S320) is "NO", the step (S210) shown in FIG. 2B is successively performed. Afterward, the turned-off function of the power switch Sb is confirmed through steps (S210) to (S240). Moreover, when the control unit 34 determines that the power switch Sb is the short-circuit fault (S240) or the open-circuit fault (340), the control unit 34 provides an alarm signal Sw to deal with the faults of the power conversion system 100, or provides a disable signal Sd to disable the frequency conversion circuit 16 (S400). In addition to the aforementioned methods and steps for detecting the turned-off and turned-on functions of the power switch Sb through the path (A) and path (B) shown in FIGS. 2A and 2B in turn. Specifically, in one embodiment, steps S200 to S240 can also be correspondingly interchanged with steps S300 to step S340. That is, the present disclosure only needs to provide a plurality of control signals Sc sequentially to turn on or turn off the power switch Sb, and cooperate with the continuous detection of the bus voltage Vbus to provide a voltage signal Sv. The detection value corresponding to the voltage signal Sv is acquired, and the control unit 34 is used to compare the current detection value with the first threshold value or the second threshold value to determine whether the power switch Sb is faulted or not and kinds of connection faults. The exchange of the above-mentioned steps is only to detect the difference in the sequence of open-circuit fault and short-circuit fault, which can completely determine whether the turned-on and turned-off functions of the power switch Sb are normal or not, and does not affect the final determination.

Figure 3:
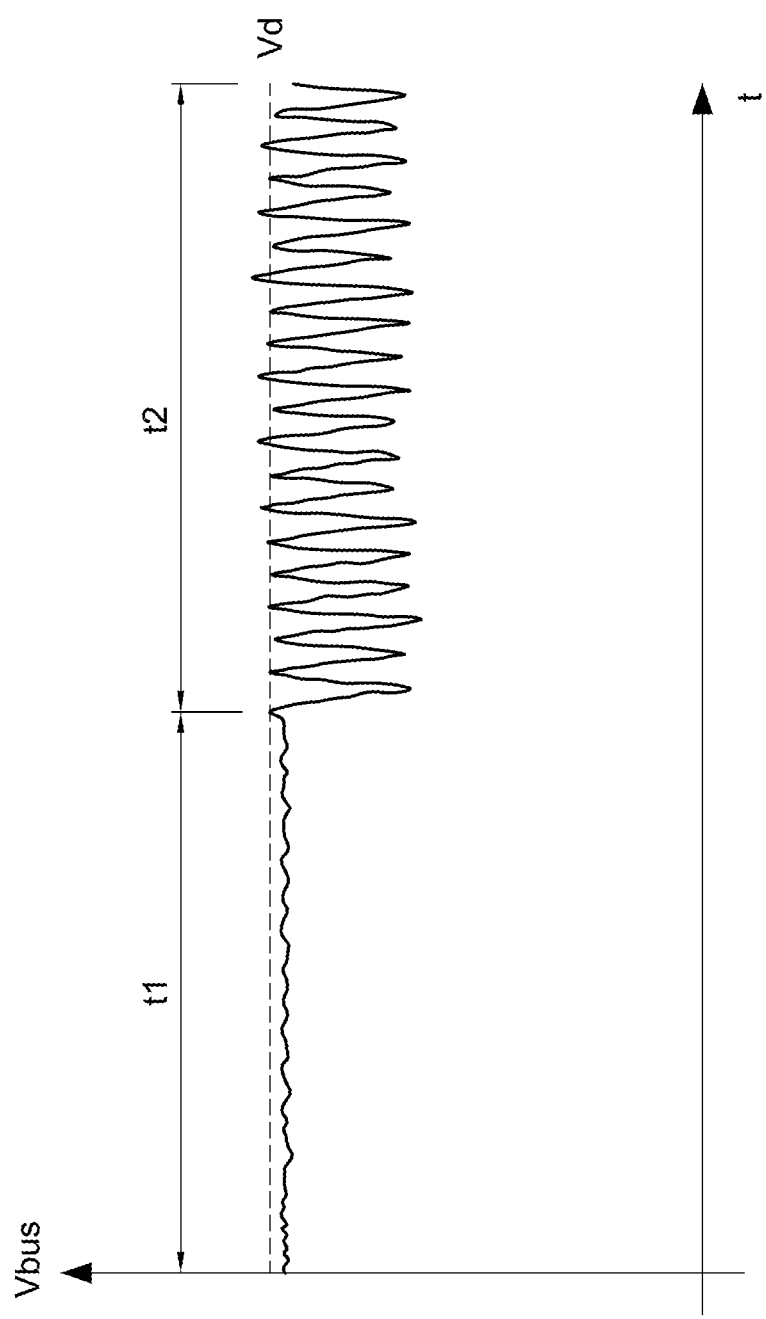
FIG. 3 is a schematic waveform of a bus voltage when turning on and turning off a power switch according to the present disclosure.

Please refer to FIG. 3, which shows a schematic waveform of a bus voltage when turning on and turning off a power switch according to the present disclosure, and also refer to FIG. 1 to FIG. 2. During a time period t1, that is, the control unit 34 provides the first control signal Sc to turn off the power switch Sb, the ripple of the bus voltage Vbus is small, and it can be regarded as a substantially smooth straight line. When the bus voltage Vbus rises to greater than or equal to a determined voltage value Vd, that is, during a time period t2, the frequency conversion circuit 16 is operated, for example but not limited to, in a power generation mode), the control unit 34 provides the second control signal Sc to turn on the power switch Sb so that the excess energy of the bus voltage Vbus is released from the braking circuit 100A composed of the bus resistor Rb, the power switch Sb, and the ground end. At this condition, the ripple of the bus voltage Vbus is large, and its waveform oscillates at a substantially fixed frequency with a certain amplitude range. Therefore, the main purpose of the present disclosure is to provide a fault detection circuit and a fault detection method for a power switch Sb. When the control unit 34 provides control signals Sc to turn on and turn off the power switch Sb, the voltage signal Sv provided by continuously detecting the bus voltage Vbus is compared with the detection values according to the voltage signal Sv since the control signals Sc are provided by the control unit 34 and which are known purposes for turning on or off the power switch Sb, thereby easily determining whether the power switch Sb is faulted and implementing the simple detection circuit and easy operation thereof. In particular, the bus resistor Rb and the power switch Sb are constructed in the braking circuit 100A.

In one embodiment, the input power source Vin may be a three-phase power source or a single-phase power source. When the power switch Sb is turned on, the ripple frequency of the bus voltage Vbus will correspond to the frequency of the input power source Vin. If the input power source Vin is the single-phase power source, the frequency of the input power source Vin is usually 60 Hz. Therefore, if the power conversion circuit 12 is a full-bridge rectifier, the ripple frequency of the bus voltage Vbus is 120 Hz. Similarly, if the input power source Vin is three-phase and the power conversion circuit 12 is a full-bridge rectifier, the ripple frequency of the bus voltage Vbus is 360 Hz. In addition, if the power conversion circuit 12 is a half-bridge rectifier, the ripple frequency is 60 Hz when the input power source Vin is the single-phase power source, and the ripple frequency is 180 Hz when the input power source Vin is the three-phase power source.

Theoretically, the ripple of the bus voltage Vbus is smaller when the control unit 34 provides the first control signal Sc to turn off the power switch Sb according to the voltage signal Sv. At this condition, however, if the first detection value Vs1 is greater than or equal to the first threshold value V1, it means that the ripple of the bus voltage Vbus is larger. Therefore, the control unit 34 determines that the power switch Sb is the short-circuit fault. Accordingly, the control unit 34 provides the alarm signal Sw and/or provides the disable signal Sd to disconnect the input switch 100B for safety. Alternatively, the control unit 34 can also notify a controller (not shown) of the power conversion system 100 so that the controller provides the disable signal Sd to disconnect the input switch 100B. On the other hand, theoretically, the ripple of the bus voltage Vbus is greater when the control unit 34 provides the second control signal Sc to turn on the power switch Sb according to the voltage signal Sv. At this condition, however, if the second detection value Vs2 is less than the second threshold value V2, it means that the ripple of the bus voltage Vbus is smaller. Therefore, the control unit 34 determines that the power switch Sb is the open-circuit fault. Accordingly, the control unit 34 provides the alarm signal Sw to deal with the faults of the power conversion system 100 and/or provides the disable signal Sd to disconnect the input switch 100B for safety. In one embodiment, the disable signal Sd or the alarm signal Sw is one of the various signals provided by the control unit 34 for dealing with the connection faults of the power conversion system 100 when the power switch Sb is determined to be faulted. The control unit 34 can respectively send the disable signal Sd or the alarm signal Sw to the input switch 100B and a controller (not shown) of the power conversion system 100, and the present disclosure is not limited thereto. Alternatively, the control unit 34 directly sends the disable signal Sd or the alarm signal Sw to the controller (not shown) of the power conversion system 100, and then the controller controls fault processing according to the received signals.

Figure 4:
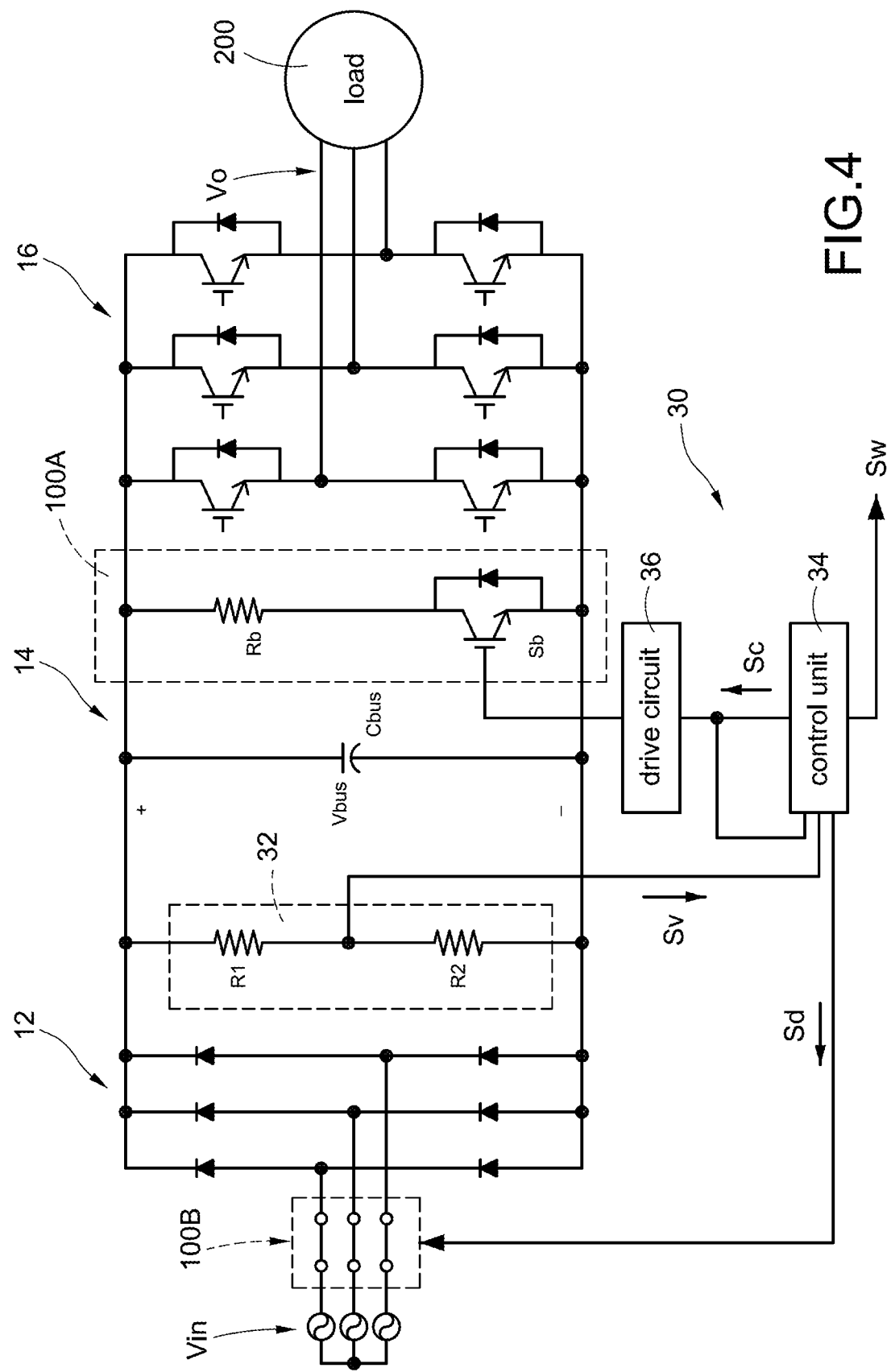
FIG. 4 is a circuit diagram of the power conversion system having a power switch fault detection circuit according to the present disclosure.

Please refer to FIG. 4, which shows a circuit diagram of the power conversion system having a power switch fault detection circuit according to the present disclosure, also refer to FIG. 1 to FIG. 3. In one embodiment, the input power source Vin is three-phase and the power conversion circuit 12 is a three-phase full-bridge rectifier according to the type of the input power source Vin. The power conversion circuit 12 has three rectifying bridge arms, and each of the rectifying bridge arms is composed of series-connected diodes. The frequency conversion circuit 16 is a three-phase frequency conversion circuit, which has three frequency-converting bridge arms, and each of the frequency-converting bridge arms is composed of series-connected switches. The detection circuit 32 is a voltage division circuit composed of two series-connected voltage division resistors R1, R2. The detection circuit 32 is electrically coupled between a positive end and a negative end of the DC bus 14, and a node between the voltage division resistor R1 and the voltage division resistor R2 is electrically coupled to the control unit 34. The bus voltage Vbus is divided by the voltage division resistors R1, R2 to generate the voltage signal Sv, and the voltage signal Sv is then provided to the control unit 34. In the DC bus 14, since the detection circuit 32 is electrically coupled to the bus capacitor Cbus and the braking circuit 100A in parallel, the voltage across the detection circuit 32 should be the same value as the bus voltage Vbus is. Therefore, the connection position of the detection circuit 32 can be adjusted according to requirements and is not intended to limit the present disclosure. After the control unit 34 receives the voltage signal Sv, the control unit 34 provides the control signal Sc to the drive circuit 36 according to the voltage signal Sv so that the control unit 34 controls the drive circuit 36 to turn on or turn off the power switch Sb. The control signal Sc may be also fed back to the control unit 34 through an electrically coupled feedback mechanism (not shown) so that the control unit 34 receives the control signal Sc provided by itself to actively realize that the specific control signal Sc is used to turn on the power switch Sb or turn off the power switch Sb.

In one embodiment, if the input power source Vin is single-phase and the output power source is also single-phase, both the power conversion circuit 12 and the frequency conversion circuit 16 can accordingly adjust their circuit structures, which will not be repeated here. In one embodiment, the detection circuit 32 is, for example but not limited to, a voltage division circuit to achieve simple operation and simple component composition. For example, the detection circuit 32 may be composed of a resistor and a capacitor electrically coupled to the resistor in series. Therefore, any detection circuit, device, or structure that can correspondingly generate a voltage signal Sv for the control unit 34 to determine according to the bus voltage Vbus should be included in the scope of the present disclosure.

Figure 5A:
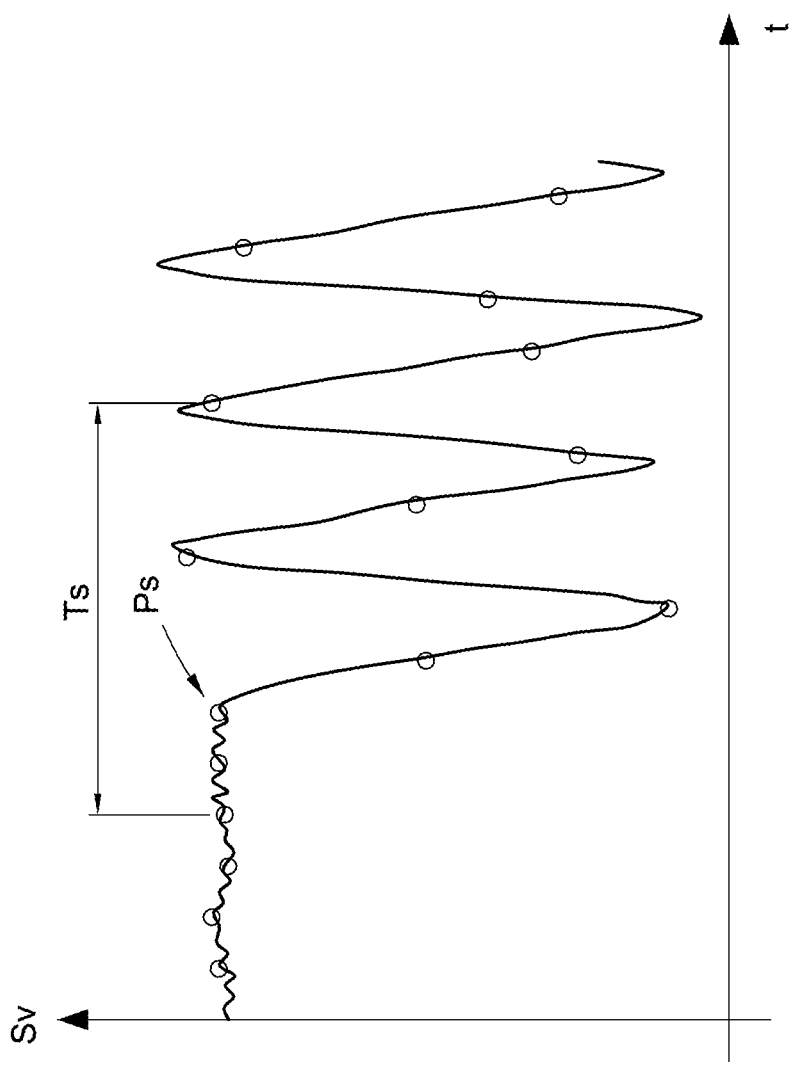
FIG. 5A is a schematic waveform of sampling a bus voltage when the power switch is turned on and turned off according to the present disclosure.

Please refer to FIG. 5A, which shows a schematic waveform of sampling a bus voltage when the power switch is turned on and turned off according to the present disclosure, and also refer to FIG. 1 to FIG. 4. Take the input power source Vin is three-phase, the power conversion circuit 12 is a three-phase full-bridge rectifier, and the detection circuit 32 is a voltage division circuit as an example. The voltage signal Sv is a signal value proportionally scaling down to the bus voltage Vbus. When the power switch Sb is turned on, the ripple of the voltage signal Sv oscillates at a frequency of approximately 360 Hz. As shown in FIG. 5A, there are a plurality of small dots, which are a plurality of sampling points Ps set by the control unit 34 according to a specific interval (i.e., a time difference) in the waveform of the voltage signal Sv. The distance between each two nearby sampling points Ps is preferably maintained the same distance, however, it can be adjusted to different distances according to actual applications. The control unit 34 can set a plurality of sampling points Ps according to a sampling frequency, and the sampling frequency can be determined by the number of phases of input power source Vin or the topology (for example, a full-bridge rectifier or a half-bridge rectifier) of the power conversion circuit 12. Specifically, since the input power source Vin may be three-phase or single-phase, and the power conversion circuit 12 may be a full-bridge or half-bridge rectifier, the sampling frequency should be, for example but not limited to, at least higher than 1000 Hz. For example, if the input power source Vin is three-phase and the power conversion circuit 12 is a full-bridge rectifier, each cycle of 360 Hz contains about 2.78 (=1000/360) sampling points.

Afterward, the control unit 34 acquires at least one detection value by calculating values of the plurality of sampling points Ps. The detection value may be a peak-to-peak value of the voltage signal Sv, that is, it mainly uses the voltage difference as the determination condition. Alternatively, the detection value may be a slope between two sampling points Ps of the voltage signal Sv, that is, it mainly uses the ripple difference when the power switch Sb is turned on or turned off as the determination condition. Alternatively, the detection value may be a voltage changing or variation rate (i.e., a voltage dropping rate or a voltage rising rate) between two sampling points Ps of the voltage signal Sv, that is, it mainly uses the voltage changing or variation in a certain time period as the determination condition. Various implementations for acquiring the detection value will be described below in order to determine whether the power switch is faulted or not according to the waveform of the voltage signal Sv, and not limiting the present disclosure.

In the embodiment, that is, the detection value is the peak-to-peak value of the voltage signal Sv, the control unit 34 takes out two sampling points Ps with the largest voltage difference in a suitable time period. Afterward, a voltage difference (namely the detection value) is acquired by subtracting voltage values of the two sampling points Ps, and an absolute value of the voltage difference is compared with a first threshold value and a second threshold value to determine whether the power switch Sb is faulted or not. If the power switch Sb is the short-circuit fault and cannot be normally turned off, the absolute value of the voltage difference is greater than or equal to the first threshold value. If the power switch Sb is the open-circuit fault and cannot be normally turned on, the absolute value of the voltage difference is less than the second threshold value. Therefore, the two conditions above can determine that the power switch Sb is connection faulted.

In the embodiment, that is, the detection value is the slope between two sampling points Ps of the voltage signal Sv, the control unit 34 calculates the slope (namely the detection value) by subtracting voltage values of two sampling points Ps and a corresponding time difference. It is assumed that the time difference is fixed, and it means that the ripple of the voltage signal Sv is larger and a changing or variation rate thereof is also greater when the slope is with a greater absolute value. On the contrary, when the slope is with a smaller absolute value, it means that the ripple of the voltage signal Sv is smaller and the changing or variation rate thereof is also smaller. Afterward, the control unit 34 determines whether the power switch Sb is faulted or not according to an absolute value of the slope voltage difference is compared with a first threshold value and a second threshold value. If the power switch Sb is the short-circuit fault, the absolute value of the slope is greater than or equal to the first threshold value. If the power switch Sb is the open-circuit fault, the absolute value of the slope is less than the second threshold value. Therefore, the two conditions above can determine that the power switch Sb is connection faulted.

In the embodiment, that is, the detection value is the voltage changing or variation rate between two sampling points Ps of the voltage signal Sv, the control unit 34 takes voltage values of two sampling points Ps of the voltage signal Sv according to the time sequence, and then divides a voltage difference between the two sampling points Ps by a voltage value of the first sampling point Ps, and then multiplies by the percentage to calculate the voltage dropping rate or voltage rising rate (namely the detection value) between the two sampling points Ps. The voltage rising rate can be calculated, for example but not limited to, (the voltage value after rising−the voltage value before rising)/(the voltage value before rising)*100%; the voltage dropping rate can be calculated, for example but not limited to, (the voltage value before dropping−the voltage value after dropping)/(the voltage value before dropping)*100%. When the voltage dropping rate or the voltage rising rate is higher, it means that the ripple of the voltage signal Sv is larger and the changing or variation rate is larger; when the voltage dropping rate or the voltage rising rate is lower, it means that the ripple of the voltage signal Sv is smaller and the changing or variation rate is smaller. Afterward, the control unit 34 determines whether the power switch Sb is faulted or not according to an absolute value of the voltage dropping rate or an absolute value of the voltage rising rate is compared with a first threshold value and a second threshold value. If the power switch Sb is the short-circuit fault, the absolute value of the voltage dropping rate or the absolute value of the voltage rising rate is greater than or equal to the first threshold value. If the power switch Sb is the open-circuit fault, the absolute value of the voltage dropping rate or the absolute value of the voltage rising rate is less than the second threshold value. Therefore, the two conditions above can determine that the power switch Sb is connection faulted.

In one embodiment, the foregoing manners of sampling and calculating the detection values are only easier to implement and have a smaller error rate, but are not limited to only acquiring the detection values in the foregoing manners. In other words, any sampling point and calculation method of the detection value through voltage value, time value, or so on that can determine whether the power switch Sb is faulted should be included in the scope of the present disclosure. In one embodiment, the control unit 34 may also set a sampling period Ts (for example, the sampling period Ts shown in FIG. 5A) in the voltage signal Sv, and set a plurality of sampling points Ps only during the set sampling period Ts. As the aforementioned control signal Sc may be a known condition, including the time point of switching, there is no need to monitor the sampling point Ps at all times in practice, thus avoid resulting in redundant sampling. Therefore, the control unit 34 can only sample the voltage value of the voltage signal Sv during the critical time period when the control signal Sc is provided to turn on or turn off the power switch Sb so as to save energy consumption and increase efficiency.

Figure 5B:
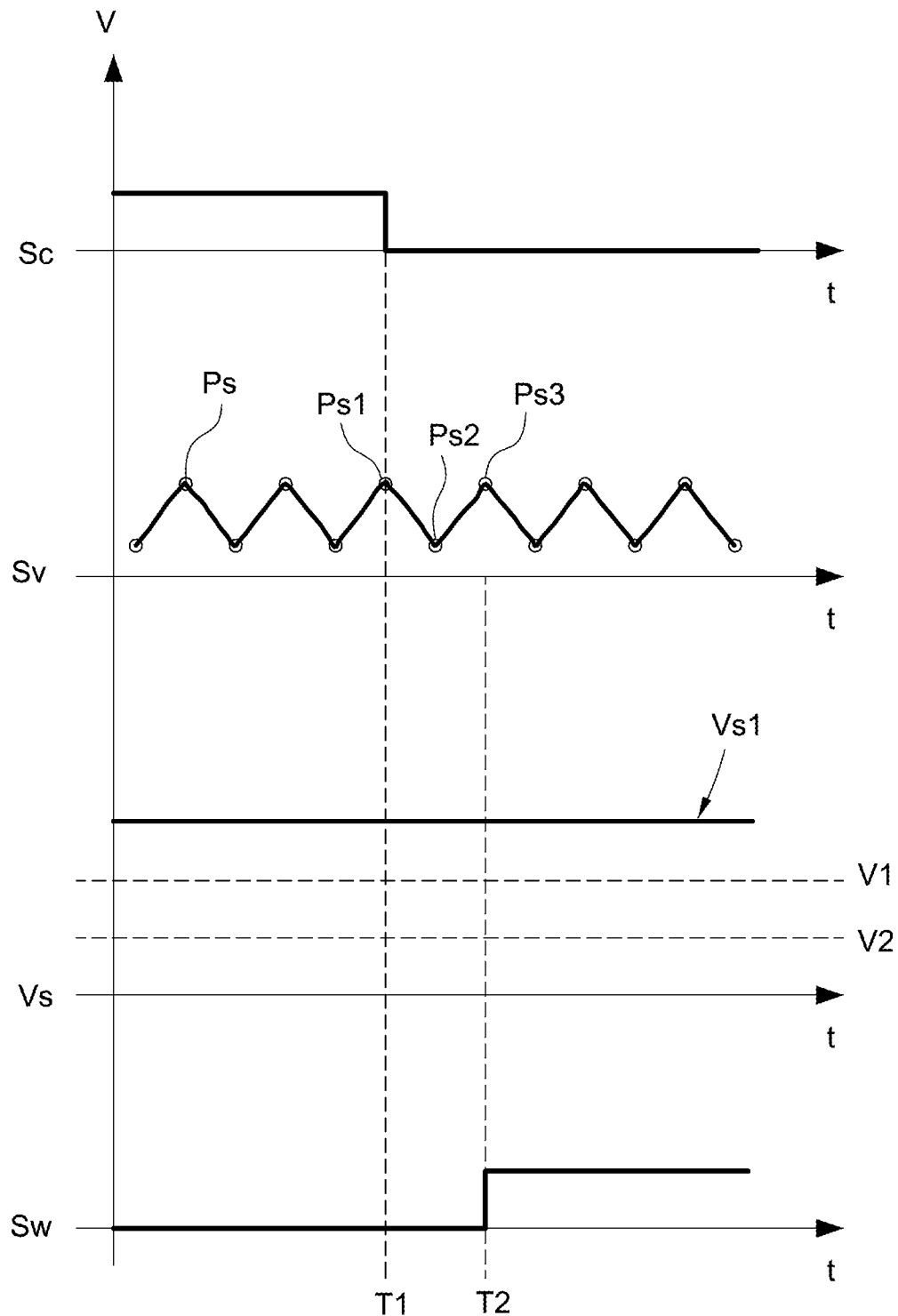
FIG. 5B is a schematic waveform of determining that the power switch is faulted when the power switch is turned off according to the present disclosure.
Figure 5C:
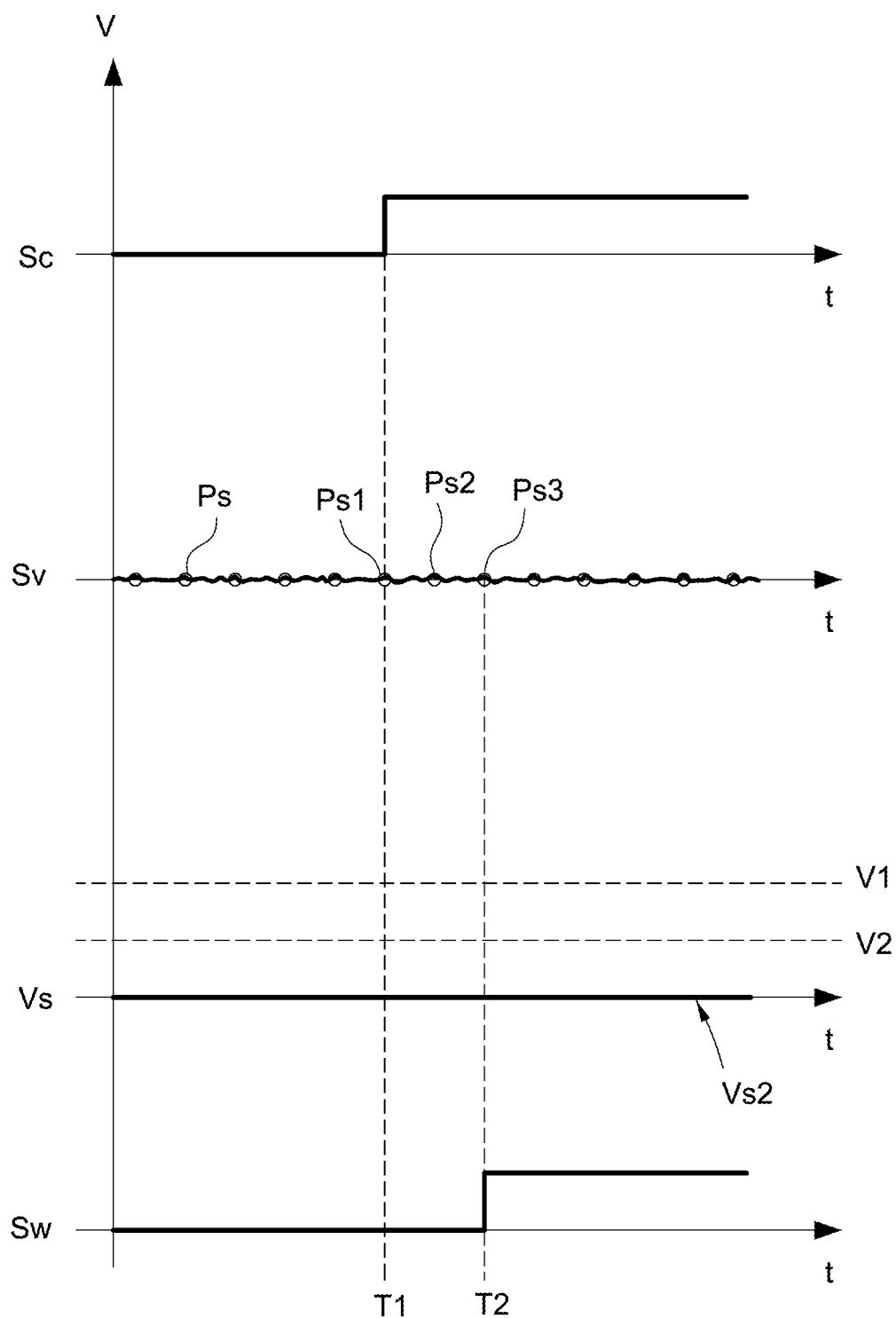
FIG. 5C is a schematic waveform of determining that the power switch is faulted when the power switch is turned on according to the present disclosure.

Please refer to FIG. 5B, which shows a schematic waveform of determining that the power switch is faulted when the power switch is turned off according to the present disclosure; please refer to FIG. 5C, which shows a schematic waveform of determining that the power switch is faulted when the power switch is turned on according to the present disclosure, and also refer to FIG. 1 to FIG. 5A. In FIG. 5B, in one embodiment, it is assumed that the power switch Sb is the short-circuit fault, and the detection value is the absolute value of the voltage difference according to the peak-to-peak value of the voltage signal Sv, and is represent by a first detection value Vs1. When the control unit 34 determines to provide a first control signal Sc to turn off the power switch Sb (time point T1) according to the bus voltage Vbus corresponding to the voltage signal Sv which is less than the predetermined value, the power switch Sb will maintain the turned-on state and cannot be turned off since the power switch Sb has a short-circuit fault at time of detecting. Therefore, after time point T1, the ripple of the voltage signal Sv is still large, and its waveform still presents a frequency oscillation of approximately 360 Hz so that several detection results of the first detection value Vs1 during the period from time point T1 to time point T2 (such as sampling points Ps1, Ps1, Ps3) are all greater than or equal to the first threshold value V1. At this condition, the control unit 34 determines that the power switch Sb is the short-circuit fault and cannot be turned off, and provides an alarm signal Sw in time point T2. The first threshold value V1 is the ripple value of the voltage signal Sv when the power switch Sb can be normally turned on, and the ripple values are sampled in a peak-to-peak manner.

In one embodiment, if the voltage difference between only two sampling points Ps1 and Ps2 is used to determine whether the power switch Sb is faulted, it may be caused by factors such as insufficient sampling points Ps, noise interference, or low resolution, which may cause the control unit 34 to misjudge. Therefore, in order to acquire the accuracy of the determination of the control unit 34, the data resolution can be increased (that is, the sampling frequency is increased) according to actual requirements, or more sampling points (for example, a sampling point Ps3 can be further used). When more sampling points Ps are used for the determination, the control unit 34 can delay the time to provide the alarm signal Sw.

In FIG. 5C, in one embodiment, it is assumed that the power switch Sb is the open-circuit fault, and the detection value is the absolute value of the voltage difference according to the peak-to-peak value of the voltage signal Sv, and is represent by a second detection value Vs2. When the control unit 34 determines to provide the second control signal Sc to turn on the power switch Sb (time point T1) according to the bus voltage Vbus corresponding to the voltage signal Sv which is less than the predetermined value, the power switch Sb will maintain the turned-off state and cannot be turned on since the power switch Sb has an open-circuit fault at time of detecting. Therefore, after time point T1, the ripple of the voltage signal Sv is still small, and its waveform is still roughly smooth and straight so that several detection results of the first detection value Vs2 during the period from time point T1 to time point T2 are all less than the second threshold value V2. At this condition, the control unit 34 determines that the power switch Sb is the open-circuit fault and cannot be turned on. Except for this, the rest of the waveforms and control determination manners are the same as in the embodiment of FIG. 5B, and the detail is omitted here for conciseness.

In summary, the embodiments of the present disclosure have the following advantages and effects.

1. The power switch fault detection circuit of the present disclosure can directly determine the state of the power switch when the frequency conversion circuit is operated in the no-load state or standby condition so as to immediately deal with the faults once the power switch fails, that is, it is not necessary to wait until components (such as but not limited to the power switch or the bus resistor) generate heat and cause damage. In particular, the power switches can be applied to the braking circuit.

2. The power switch fault detection circuit of the present disclosure can directly detect the bus voltage and then compare with the known control signal to evaluate the state of the power switch without adding additional hardware to detect the state of the power switch or the output power of the power conversion system, thereby reducing the cost of system construction and the complexity of determination.

3. When the known control signal is used to control turning on or turning off the power switch, the control unit is used to compare the ripple value of the voltage signal when the power switch is normally turned on or turned off according to the detection value corresponding to the bus voltage at time of detecting so as to determine whether the power switch is faulted, which can make the operation simpler and faster.

Although the present disclosure has been described with reference to the preferred embodiment thereof, it will be understood that the present disclosure is not limited to the details thereof. Various substitutions and modifications have been suggested in the foregoing description, and others will occur to those of ordinary skill in the art. Therefore, all such substitutions and modifications are intended to be embraced within the scope of the present disclosure as defined in the appended claims.

What is claimed is:

1. A power switch fault detection method configured to determine whether a power switch coupled to a DC bus between an output side of a power conversion circuit and an input side of a frequency conversion circuit is faulted, the method comprising:
- (a) receiving in a no-load state, by a control unit, a voltage signal provided by continuously detecting a bus voltage of the DC bus, and acquiring at least one detection value according to the voltage signal;
- (b) determining, by the control unit, whether a first control signal provided to turn off the power switch; if a determination result is "YES", the first control signal is provided to turn off the power switch, and if the determination result is "NO", a second control signal is provided to turn on the power switch;
- (c) comparing, by the control unit, whether a first detection value acquired corresponding to the voltage signal is greater than or equal to a first threshold value when the first control signal is provided to turn off the power switch; if a comparison result is "YES", the power switch is determined to be a short-circuit fault, and if the comparison result is "NO", the power switch is determined to be normally turned off;
- (d) comparing, by the control unit, whether a second detection value acquired corresponding to the voltage signal is less than a second threshold value when the second control signal is provided to turn on the power switch; if a comparison result is "YES", the power switch is determined to be an open-circuit fault, and if the comparison result is "NO", the power switch is determined to be normally turned on; and
- (e) providing, by the control unit, an alarm signal or a disable signal when the power switch is determined to be the short-circuit fault or the open-circuit fault.

2. The power switch fault detection method as claimed in claim 1, wherein "acquiring at least one detection value according to the voltage signal" of the step (a) comprises:
- (a1) setting a plurality of sampling points in the voltage signal, and
- (a2) acquiring at least one detection value by calculating the plurality of sampling points.

3. The power switch fault detection method as claimed in claim 2, wherein "acquiring at least one detection value by calculating the plurality of sampling points" of the step (a2) comprises:
acquiring a peak-to-peak value corresponding to the bus voltage by calculating the plurality of sampling points, acquiring a slope corresponding to the bus voltage by calculating the plurality of sampling points, or acquiring a voltage variation rate corresponding to the bus voltage by calculating the plurality of sampling points.

4. The power switch fault detection method as claimed in claim 1, further comprises:
determining, by the control unit, whether the DC bus is in the no-load state before "receiving the voltage signal" of the step (a); and if a determination result is "NO", repeating the step until the DC bus is in the no-load state.

5. The power switch fault detection method as claimed in claim 1, wherein after "the power switch is determined to be normally turned off" of the step (c) further comprises:
providing the second control signal to detect whether the power switch is to be normally turned on, and
after "the power switch is determined to be normally turned on" of the step (d) further comprising a step of: providing the first control signal to detect whether the power switch is to be normally turned off.

* * * * *